(12) United States Patent
Lequenne

(10) Patent No.: US 6,448,508 B1
(45) Date of Patent: Sep. 10, 2002

(54) ELECTRICAL COMPONENT WITH A FLEXIBLE STRIP OF CONNECTING CONDUCTORS

(75) Inventor: Yves Lequenne, Reuil Malmaison (FR)

(73) Assignee: Sagem SA, Paris (FR)

( * ) Notice: Subject to any disclaimer, the term of this patent is extended or adjusted under 35 U.S.C. 154(b) by 0 days.

(21) Appl. No.: 09/564,480

(22) Filed: May 4, 2000

(30) Foreign Application Priority Data

May 7, 1999 (FR) .............................. 99 05825

(51) Int. Cl.⁷ ................................ H01R 9/09
(52) U.S. Cl. ................. 174/261; 361/737; 361/776; 324/555
(58) Field of Search ................. 174/254, 261; 361/737, 776; 134/35 R; 324/528, 555, 537, 538

(56) References Cited

U.S. PATENT DOCUMENTS 5,288,950 A  *  2/1994  Ushio et al. ............... 174/254
5,304,987 A     4/1994  Brunson et al. ........... 340/654
5,309,316 A  *  5/1994  Yagi et al. ................ 361/749
5,526,217 A     6/1996  Gormley et al. .......... 361/119
5,717,556 A  *  2/1998  Yanagida .................. 361/803
5,844,783 A  * 12/1998  Kojima .................... 361/777
5,920,465 A  *  7/1999  Tanaka .................... 361/784
6,201,689 B1 *  3/2001  Miyasyo .................. 361/681

FOREIGN PATENT DOCUMENTS

WO    WO 94/07318    3/1994

* cited by examiner

*Primary Examiner*—Albert W. Paladini
(74) *Attorney, Agent, or Firm*—Miles & Stockbridge P.C.

(57) ABSTRACT

An electrical component is provided with a flexible strip (10) of connection conductors (11–16), which comprises two conductors (11, 16) for testing continuity, which are connected by the component and extending along the edges of the strip (10).

14 Claims, 1 Drawing Sheet

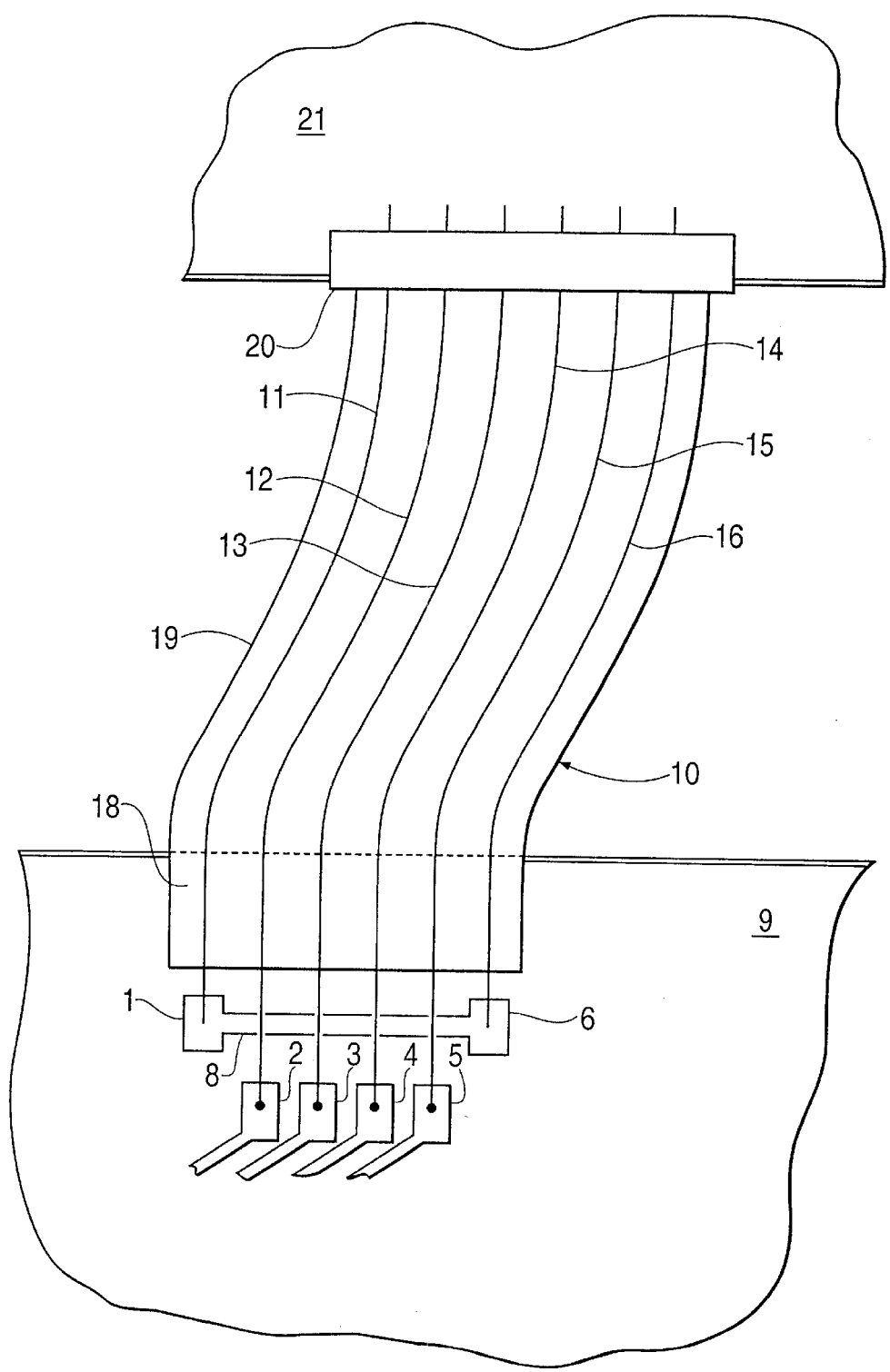

ELECTRICAL COMPONENT WITH A FLEXIBLE STRIP OF CONNECTING CONDUCTORS

BACKGROUND OF THE INVENTION

The invention relates to flexible circuits or films of electrical conductors forming a strip serving to connect two printed circuit boards or other electrical components of a device.

The flexibility of the strip makes it possible, during handling, to move the boards which are connected thereto.

Each conductor end of the strip is electrically connected to a board track or a connector terminal, in general by soldering. In order to avoid these soldered connections, which are relatively fragile, from being inadvertently pulled off, the end zone of the strip of conductors is fixed, for example stuck (adhered), flat against the board. The soldered connections thus do not serve for mechanical attachment.

However, during handling, it is not impossible for the technician inadvertently to pull on the strip and to tear or detach it wholly or partially from the board. In such a case, the soldered connections lose the mechanical protection provided to them by the adhesion of the strip and they may be destroyed by being pulled off.

The faulty operation which will result from this may possibly be detected by the technician who will have to try to repair the tracks pulled off and to solder the conductors thereto again. More seriously, it may even be the case that some conductors are pulled off the tracks but remain in contact therewith by reason of the strip still being held in place by the other conductors. For this reason the fault in the operation will only appear later, in the event of vibrations, and will be very difficult to locate.

SUMMARY OF THE INVENTION

The present invention aims to facilitate the detection of such a situation.

To this end the invention relates to an electrical component provided with a flexible strip of connection conductors, characterised in that the strip comprises two conductors for testing continuity, which are connected by the component.

Thus if the strip of conductors is torn, the connection of the test conductors is broken and the tear is thus detected.

The component advantageously bears a track for connecting the test conductors of the strip.

BRIEF DESCRIPTION OF THE DRAWING

The invention will be better understood with the aid of the following description of a preferred embodiment of the electrical component of the invention, with reference to the single FIGURE attached which shows a flexible film of conductors stuck on the component of the invention and connected to a connector.

DESCRIPTION OF THE PREFERRED EMBODIMENTS

In the FIGURE, the component of the invention is a printed circuit board 9 provided with a flexible strip 10 of electrical conductors 11–16 to which it is connected mechanically and electrically. These are conductive tracks printed on a polyester film 19.

The strip 10 is flat when at rest but it can naturally be deformed. In this case it is connected, at its end opposite the board 9, to a connector 20 intended to receive another printed circuit board 21 bearing electrical circuits. The mechanical connection to the connector 20 is achieved by sticking thereto or by the strip 10 being pinched therein.

The board 9 comprises six soldering points 1 to 6 on which the ends of the respective tracks 11 to 16 are soldered. In this example, the lateral tracks 11 and 16 are shorter than the central tracks 12 to 15. In this way, an end zone 18 of the strip 10 being stuck flat against a zone, in this case a lateral zone, of the board 9, the central points 2 to 5 are connected to the connector 20 by the central tracks 12–15 which are longer than the lateral tracks 11 and 16 located close to the respective lateral edges of the strip 10.

The board 9 bears a track 8 which constitutes a loop connection connecting one of the tracks 11–16 to one of the others.

In this example, it is the two tracks 11 and 16 extending along the edges of the strip 10 which are looped by the track 8.

The board 9, with the strip 10, thus comprises two conductors for testing continuity, which are connected by the board 9 and more precisely by the track 8.

Thus if the strip 10 is torn or pulled off the board 9 by an excessive traction strain of the connector 20, the continuity of the loop of the test conductors is broken and it is thus possible to detect the fault by a monitoring circuit. In this example, as it is the lateral tracks 11 and 16 which serve as test conductors, it is one of these two which will first be broken or pulled off its soldering point 1 or 6 in the event of excessive twisting of the strip 10. Thus a fault can be detected even if the strip 10 is not damaged too badly.

The remote board 21 comprises a test member or circuit, not shown, connected by the connector 20 to the relevant ends of the looped tracks by their remote ends, in this case 11 and 16. The test circuit verifies the continuity of the loop formed by the two tracks 11 and 16, the looping track 8 and the two soldered connections of the points 1 and 6. This may be, for example, a resistor in series with the entry diode of an optocoupler, the assembly being supplied by a power supply of the board 21 but via the loop 11, 8, 16. The activated optocoupler turns off a transistor or logic gate and its deactivation by opening of the test loop causes the transistor to be tuned on, which illuminates a light-emitting diode to indicate a fault. Provision can be made for this transistor to cause a request for interruption to a microprocessor which can thus signal the existence of the fault discovered, by displaying or transmitting information.

The excess length of the central tracks 12–15 with respect to the lateral test tracks 11 and 16 means that the tracks 12-15 are at no risk of being pulled off the board 9 even if the strip 10 is folded back, ie detached, over the board 9 as long as the ends of the two lateral tracks 11 and 16 both remain fixedly attached to the board 9.

The mechanical attachment between the strip 10 of conductors and the board 9 could be produced other than by sticking, for example by pinching in a connector such as that referenced 20. In the same way, the board 9 could be replaced by any other electrical component, for example a display or a relay. Furthermore, the strip 10 being pulled off at the connector 20 of the board 21 will still be detected.

It will be noted, furthermore, that the monitoring or test circuit described above, checking the continuity of the loop 11, 8, 16, could itself, in one variation, be disposed on the board 9. In such a case this test circuit would remotely supply, for example the remote ends of the lateral tracks 11 and 16 at the connector 20 via two of the central tracks 12–15, thus looped at this location (20) on the ends of the respective tracks 11, 16. In a more general way, it would be possible to form a sort of serpentine with four test tracks in series with the test members, preferably with at least one lateral track 11, 16 and even both 11, 16 as in this case. Thus any first (11) of the four tracks mentioned above would be supplied with current or voltage at the board 9 by looping it onto any second track (13) at the connector 20, this second track (13) would be looped onto any third track (16) on the board 9, which would itself be looped on the fourth track (14) at the connector 20. The points 1 and 4 would then be connected by the four looped tracks 11, 13, 16 and 14 and the continuity of this loop would be monitored locally.

What is claimed is:

1. An electrical component provided with a flexible strip of electrical conductors that are mechanically and electrically connected to said component, wherein said component completes a short-circuit between two of said conductors that extend along and are disposed closest to opposite edges of said strip, respectively.

2. A component according to claim 1, wherein said conductors of said strip have connecting portions that project from an end of said strip to electrical connection points with said component, and the connecting portions of said two conductors are shorter than the connecting portions of other conductors of said strip.

3. A component according to claim 1, wherein said conductors of said strip have terminal ends electrically connected to said component, and the terminal ends of said two conductors are offset in a longitudinal direction of said strip from the terminal ends of other conductors of said strip are connected to said component.

4. A component according to claim 1, wherein said component is a circuit board.

5. A component according to claim 4, wherein said strip crosses over an edge of said circuit board, and said two conductors are electrically connected to said circuit board closer to said edge than are other conductors of said strip.

6. A component according to claim 1, wherein said component has a conductive path that extends between connection points at which said two conductors are electrically connected to said component.

7. A component according to claim 1, wherein said short-circuit between said two conductors includes another conductor of said strip.

8. A component according to claim 1, wherein said two conductors are electrically connected to a continuity testing circuit which verifies continuity of an electrical path through said two conductors.

9. An electrical component provided with a flexible connector strip including a plurality of electrical conductors having connecting portions that project from one end of the strip and that are electrically connected to said component, wherein two laterally outermost of said connecting portions are shorter than others of said connecting portions.

10. An electrical component according to claim 9, wherein said component completes a short-circuit between said two connecting portions.

11. An electrical component according to claim 10, wherein said short-circuit between said two connecting portions includes another of said connecting portions.

12. A component according to claim 9, wherein said component is a circuit board.

13. A component according to claim 9, wherein said strip crosses over an edge of said circuit board, and said two connecting portions are electrically connected to said circuit board closer to said edge than are said other connecting portions.

14. A component according to claim 9, wherein the conductors having said two connecting portions are electrically connected to each other by said component and to a continuity testing circuit that verifies continuity of a circuit path through those conductors.

* * * * *